(12) United States Patent
Radan

(10) Patent No.: US 9,151,794 B2
(45) Date of Patent: Oct. 6, 2015

(54) FAULT DETECTION SYSTEM AND METHOD, AND POWER SYSTEM FOR SUBSEA PIPELINE DIRECT ELECTRICAL HEATING CABLES

(75) Inventor: Damir Radan, Sandnes (NO)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/130,494

(22) PCT Filed: Jun. 20, 2012

(86) PCT No.: PCT/EP2012/061863
§ 371 (c)(1),
(2), (4) Date: Mar. 23, 2015

(87) PCT Pub. No.: WO2013/004500
PCT Pub. Date: Jan. 10, 2013

(65) Prior Publication Data
US 2015/0212137 A1     Jul. 30, 2015

(30) Foreign Application Priority Data
Jan. 7, 2011   (EP) .................................... 11172392

(51) Int. Cl.
*G01R 31/02* (2006.01)
*G01R 25/00* (2006.01)

(52) U.S. Cl.
CPC ................ *G01R 31/02* (2013.01); *G01R 25/00* (2013.01)

(58) Field of Classification Search
CPC ...... G01M 11/088; H05B 3/56; F16L 53/007; H01B 7/045
USPC ........................................................ 324/537
See application file for complete search history.

(56) References Cited

U.S. PATENT DOCUMENTS

| | | | | |
|---|---|---|---|---|
| 6,142,707 | A  * | 11/2000 | Bass et al. ..................... | 405/158 |
| 8,005,324 | B2 * | 8/2011 | Bremnes ......................... | 385/12 |
| 2003/0016028 | A1 * | 1/2003 | Bass ............................. | 324/642 |
| 2004/0032265 | A1 | 2/2004 | Turner | |
| 2004/0060693 | A1 * | 4/2004 | Bass et al. ....................... | 166/57 |
| 2004/0100273 | A1 * | 5/2004 | Liney et al. .................... | 324/534 |
| 2006/0243471 | A1 * | 11/2006 | Karlsen et al. ............... | 174/15.1 |
| 2007/0044992 | A1 * | 3/2007 | Bremnes ................... | 174/102 R |

(Continued)

FOREIGN PATENT DOCUMENTS

| | | |
|---|---|---|
| EP | 0 079 504 A1 | 5/1983 |
| WO | WO 2004/111519 A1 | 12/2004 |

(Continued)

OTHER PUBLICATIONS

European Search Report and Written Opinion dated Dec. 15, 2011 for corresponding EP 11 17 2392.0.

(Continued)

*Primary Examiner* — Benjamin M Baldridge
(74) *Attorney, Agent, or Firm* — Lempia Summerfield Katz LLC

(57) ABSTRACT

A fault detection system for subsea pipeline direct electrical heating cables is provided. The fault detection system includes a first ammeter for measuring a first phase current, a second ammeter for measuring a second phase current, and a third ammeter for measuring a third phase current. The fault detection system also includes a first calculation unit for calculating a negative sequence current from the first phase current, the second phase current, and the third phase current, and a first detection unit for detecting a change in the negative sequence current.

19 Claims, 3 Drawing Sheets

(56) References Cited

U.S. PATENT DOCUMENTS

| | | |
|---|---|---|
| 2007/0098375 A1 * | 5/2007 | Kinnari et al. ............... 392/301 |
| 2009/0033336 A1 * | 2/2009 | Blanchard ..................... 324/537 |
| 2009/0214196 A1 * | 8/2009 | Bremnes ....................... 392/480 |
| 2010/0182012 A1 * | 7/2010 | Harmon ........................ 324/537 |
| 2012/0018421 A1 * | 1/2012 | Parman et al. ............... 219/546 |

FOREIGN PATENT DOCUMENTS

| | | | |
|---|---|---|---|
| WO | WO 2006075913 A1 * | 7/2006 | |
| WO | WO 2006/130722 A2 | 12/2006 | |
| WO | WO 2007/096775 A2 | 8/2007 | |
| WO | WO 2010/031626 A1 | 3/2010 | |
| WO | WO 2010/108976 A1 | 9/2010 | |

OTHER PUBLICATIONS

PCT International Search Report and Written Opinion of the International Searching Authority dated Nov. 9, 2012 for corresponding PCT/EP2012/061863.

* cited by examiner

FAULT DETECTION SYSTEM AND METHOD, AND POWER SYSTEM FOR SUBSEA PIPELINE DIRECT ELECTRICAL HEATING CABLES

This application is the National Stage of International Application No. PCT/EP2012/061863, filed Jun. 20, 2012, which claims the benefit of European Patent Application No. EP 11172392, filed Jul. 1, 2011. The entire contents of both documents are hereby incorporated herein by reference.

FIELD

The present embodiments relate to the field of electrical heating of pipeline systems. More particularly, the present embodiments relate to a fault detection system, a power system, a fault detection method, program element and computer-readable medium for subsea pipeline direct electrical heating cables.

BACKGROUND

Formation of hydrates is a well-known problem in subsea production systems for oil and gas. Several options are available to solve this problem. Traditionally, chemicals have been used. Recently, a more effective direct electric heating method is used for heating of the pipeline by forcing a high electric current through the pipeline. A subsea pipeline direct electrical heating cable is installed parallel to and connected to a distant end of the pipeline, as shown in WO 2004/111519 A1, for example.

A power system for providing a subsea pipeline direct electrical heating cable with power from a three-phase power grid has been described in WO 2010/031626 A1, for example.

The subsea pipeline direct electrical heating cable has a linearly decreasing voltage, from an input value at a power in-feed end to zero at the grounded, remote end. Consequently, the electric filed stress on the cable insulation also decreases linearly, from a normal operating stress at the power in-feed end to zero at the remote end.

A cable fault in the remote region may be initiated by a mechanical damage (e.g., a cut extending through the outer sheath and the insulation system), thus exposing the copper conductor to seawater. As the conductor is connected to ground at the remote end, the fault will shunt a remaining length from fault location to grounded end. The corresponding change in conductor current will be minute and extremely difficult to detect at the opposite end of a subsea pipeline direct electrical heating cable. A current measurement may be done even further upstream, making small changes even harder to detect. The conductor current in a subsea direct electrical heating system may be larger than 1000 A, and a fault current of 10 A through the physical fault will translate into a far smaller change at the in-feed end (e.g., due to phase shifting). Even with the best available current measuring equipment, cable faults near the remote end will therefore pass on undetected.

An electric current flowing out from the surface of a copper conductor and into seawater will cause rapid corrosion (e.g., alternative current corrosion) of the copper conductor, even at small current levels or voltage differences. If such a fault goes undetected, the final outcome will be a complete corrosion break of the copper conductor. A seawater filled gap is thus introduced between the two "conductor stubs," but the electric impedance of this gap may not be sufficiently large to cause a detectable change in current at the in-feed end of the DEH system. As the gap will not be capable of withstanding the source voltage, an electric arc is then formed between the two "conductor stubs". The temperature associated with such arcing is several thousand degrees Celsius, so a rapid melt-down of the copper conductor as well as any polymer in the vicinity will occur. The boiling temperature of seawater at most relevant water depths will be above the polymer melting points, so "water cooling" will not prevent the described melt-down from taking place.

The subsea pipeline direct electrical heating cable is commonly placed as close to the thermally insulated pipeline as possible. The thermal insulation will thus also be melted down by a fault, as described above. Once the steel pipeline is exposed to seawater, the steel pipeline will appear as an alternative, and probably low-impedance, return path for the fault current. As the copper conductor is continuously eroded away and widening the gap between the "stubs", the pipeline will at some point in time become the lowest impedance return path. At that time, a new arc will be established between the conductor stub (e.g., in-feed side) and the steel pipeline. A rapid melt through of the pipeline's steel wall may result, and the pipeline contents may escape implying severe environmental pollution.

In WO 2007/096775 A2, a fault detection system for subsea pipeline direct electrical heating cables is provided. The system proposed is based on fiber optic elements included in the subsea pipeline direct electrical heating cables. Accordingly, the known fault detection system is not suitable for existing installations.

WO 2006/130722 A2 discloses an apparatus and method for determining a faulted phase resulting from a fault in a three-phase ungrounded power system. The known method includes comparing a phase angle of an operating phasor to a phase angle of a fixed reference phasor. The operating phasor is derived from a digitized signal sample of a plurality of measured signals of the power system. The known method also includes comparing a phase angle difference between the operating phasor and the fixed reference phasor to at least one threshold to determine the faulted phase. The fixed reference phasor may be a phase-to-phase voltage or a positive sequence voltage of the plurality of measured signals of the power system. The operating phasor may be a zero sequence current, a zero sequence voltage or a combination of a zero sequence current and a zero sequence voltage of the plurality of measure signals of the power system.

EP 0 079 504 A1 describes a method and an apparatus for detecting a single-phase-to-ground fault on a three-phase electrical power system, and for identifying a faulted phase. A single-phase-to-ground fault is correctly distinguished from other faults (e.g., including phase-to-phase-to-ground faults, even with transmission lines that utilize series capacitors) by taking into consideration the phase-to-phase voltage, which is in quadrature with the voltage to ground of the monitored phase.

US 2004/0032265 A1 discloses a double-ended distance-to-fault location system using time-synchronized positive-or-negative-sequence quantities for a three-phase transmission line.

SUMMARY AND DESCRIPTION

The fault detection systems proposed in WO 2006/130722 A2, EP 0 079 504 A1, and US 2004/0032265 A1 do not take into account the special requirements for subsea electrical heating installations. For example, these fault detection systems do not relate to subsea power consumers like direct electrical heating cables.

There may be a need for a fault detection system for subsea pipeline direct electrical heating cables, a power supply for subsea pipeline direct electrical heating cables, a fault detection method for subsea pipeline direct electrical heating cables, a fault detection program element for subsea pipeline direct electrical heating cables and a corresponding computer-readable medium that are suitable for existing as well as new installations.

The scope of the present invention is defined solely by the appended claims and is not affected to any degree by the statements within this summary.

The present embodiments may obviate one or more of the drawbacks or limitations in the related art. For example, the need described above may be met by the present embodiments.

In one embodiment, a fault detection system for subsea pipeline direct electrical heating cables is provided. The fault detection system includes a first ammeter for measuring a first phase current, a second ammeter for measuring a second phase current, and a third ammeter for measuring a third phase current. The fault detection system also includes a first calculation unit for calculating a negative sequence current from the first phase current, the second phase current, and the third phase current, and a first detection unit for detecting a change in the negative sequence current.

In this way, a defect even at the distant end of a subsea pipeline direct electrical heating cable may be detected. The method may be used for already existing subsea pipeline direct electrical heating cables, as all measuring equipment may be installed above the surface. This may also reduce costs, as no subsea operations may be necessary.

According to a first embodiment of the fault detection system, the fault detection system further includes a second calculation unit for calculating a positive sequence current form the first phase current, the second phase current, and the third phase current, and a third calculation unit for dividing the negative sequence current by the positive sequence current to obtain a relative negative sequence current. The first detection unit is adapted to detect a change in the relative negative sequence current.

The positive sequence current may only experience small changes in case of subsea pipeline direct electrical heating cable failures and may be essentially dependent on the operating voltage of the subsea pipeline direct electrical heating cable. Using the relative negative sequence current as control may allow defining a single threshold value for detecting a subsea pipeline direct electrical heating cable fault even when the subsea pipeline direct electrical heating cable is operated with different operating voltages. Operating the subsea pipeline direct electrical heating cable with different operating voltages may allow a safe transport of fluids trough the associated subsea pipeline when the fluids have varying compositions and/or the ambient temperature of the subsea pipeline changes.

According to a second embodiment of the fault detection system, the fault detection system also includes a fourth calculation unit for calculating a sequence impedance matrix $Z_s$. The sequence impedance matrix $Z_s$ may be derived from the negative sequence current and the positive sequence current. The sequence impedance matrix $Z_s$ may be used to estimate the location of the subsea pipeline direct electrical heating cable fault.

According to a further embodiment of the fault detection system, the fault detection system also includes a second detection unit adapted to receive a signal indicating a malfunctioning of a symmetrizing unit.

Loads like subsea direct electrical heating cables may be symmetrized by a symmetrizing unit before connecting the loads to a three phase network. The symmetrizing unit may be positioned above sea level and accordingly may easily be monitored. If a malfunctioning of the symmetrizing unit is detected, this may be communicated via a signal to the fault detection system. The fault detection unit may therefore prevent that a change in the negative sequence current due to a malfunctioning of the symmetrizing unit is erroneously attributed to the subsea pipeline direct electrical heating system. A fault detection system with a second detection unit adapted to receive a signal indicating a malfunctioning of the symmetrizing unit may be more reliable.

According to another embodiment of the fault detection system, the fault detection system also includes a third detection unit adapted to receive a signal indicating a malfunctioning of a balancing unit.

Electrical loads may include resistive impedances as well as reactive impedances. Such a load may be balanced by a balancing unit to reduce cable cross sections to the power network. A malfunctioning of the balancing unit may affect the negative sequence current too. Adding a third detection unit adapted to receive a signal indicating a malfunctioning of the balancing unit may therefore further ameliorate the reliability of the fault detection system.

According to one embodiment, a power supply for subsea pipeline direct electrical heating cables is provided. The power supply includes a symmetrizing unit for symmetrizing a load, and a fault detection system, as has been described as hereinbefore.

A power supply according to one or more of the present embodiments may provide a reliable device for energizing a subsea direct electrical heating cable with a three phase power grid. For example, the symmetrizing unit may reduce the load experienced by the power grid.

The symmetrizing unit may include a first capacitor device and an inductor device both adaptable to the impedance of the subsea direct electrical heating cable. The direct electrical heating cable may be connected to the first phase and the third phase of the power grid, the first capacitor device between the first phase and the second phase of the power grid and the inductor device between the second phase and the third phase of the power grid.

According to an embodiment of the power supply, the power supply also includes a balancing unit for balancing the load.

A balancing unit may include a second capacitor device that compensates the reactive part of the load and thus may help to enhance power transmission efficiency.

According to another embodiment of the power supply, the power supply also includes a local fault detection device. The local fault detection device may allow the detection of a malfunctioning of the symmetrizing unit and/or the balancing unit. For example, the local fault detection device may provide the fault detection system with signals indicating a malfunctioning of the symmetrizing unit and/or the balancing unit. As has been described hereinbefore, such signals may prevent an erroneous detection of a subsea pipeline direct electrical heating cable.

According to another embodiment, a fault detection method for subsea pipeline direct electrical heating cables is provided. The fault detection method includes measuring a first phase current, measuring a second phase current, and measuring a third phase current. The fault detection method also includes calculating a negative sequence current from the first phase current, the second phase current, and the third phase current, and detecting a change in the negative sequence current.

This fault detection method for subsea pipeline direct electrical heating cables may be applied to already installed subsea pipeline direct electrical heating cables. All method acts may be performed above sea level. Subsea measuring or detection devices may be omitted.

According to an embodiment of the fault detection method, the fault detection method also includes calculating a positive sequence current from the first phase current, the second phase current, and the third phase current. The fault detection method includes dividing the negative sequence current by the positive sequence current to obtain a relative negative sequence current, and detecting a change in the negative sequence current by detecting a change in the relative negative sequence current.

Such an embodiment may allow selecting only one threshold value for fault detection even if the subsea pipeline direct electrical heating cable is subjected to different operating voltages.

According to a further embodiment of the fault detection method, the fault detection method also includes calculating a sequence impedance matrix $Z_s$ from the first phase current, the second phase current, and the third phase current. The fault detection method includes calculating a change of sequence voltages based on the sequence impedance matrix, and calculating a load impedance change based on the change of sequence voltages.

A determination of the load impedance change may help to estimate the location of the subsea pipeline direct electrical heating cable fault. Accordingly, the subsea pipeline direct electrical heating cable may be repaired faster.

According to one embodiment, a fault detection program element for subsea pipeline direct electrical heating cables is provided.

The program element may be easily adaptable to new types of power supplies for subsea pipeline direct electrical heating cables. The program element may be executed by a data processor of an existing power supply for subsea pipeline direct electrical heating cables, thus providing a facile way to improve the reliability of subsea pipeline direct electrical heating.

The program element may be implemented as computer readable instruction code in any suitable programming language, such as, for example, JAVA, C++, and may be stored on a computer-readable medium (e.g., removable disk, volatile or non-volatile memory, embedded memory/processor, etc.). The instruction code is operable to program a computer or any other programmable device to carry out the intended functions. The program element may be available from a network, such as the World Wide Web, from which the program element may be downloaded.

The fault detection method may be realized by a computer program (e.g., software). However, one or more of the present embodiments may also be realized by one or more specific electronic circuits (e.g., hardware). The fault detection method may also be realized in a hybrid form (e.g., in a combination of software modules and hardware modules).

According to another embodiment, a computer-readable medium on which there is stored a computer program for processing a physical object is provided. The computer program, when being executed by a data processor, is adapted for controlling and/or carrying out the fault detection method as described hereinbefore.

The computer-readable medium (e.g., a non-transitory computer-readable storage medium) may be readable by a computer or a processor. The computer-readable medium may be, for example, but not limited to an electric, magnetic, optical, infrared or semiconductor system, device or transmission medium. The computer-readable medium may include at least one of the following media: a computer-distributable medium, a program storage medium, a record medium, a computer-readable memory, a random access memory, an erasable programmable read-only memory, a computer-readable software distribution package, a computer-readable signal, a computer-readable telecommunications signal, computer-readable printed matter, and a computer-readable compressed software package.

Embodiments have been described with reference to different subject matters. For example, some embodiments have been described with reference to a method, whereas other embodiments have been described with reference to an apparatus. However, a person skilled in the art will gather from the above and the following description that, unless otherwise notified, in addition to any combination of features belonging to one type of subject matter, also any combination between features relating to different subject matters (e.g., between features of the method and features of the apparatus) is considered as to be disclosed within this document.

The aspects defined above and further aspects of the present embodiments are apparent from the examples described hereinafter and are explained with reference to the examples of embodiments. The present embodiments will be described in more detail hereinafter with reference to examples but to which the invention is not limited.

DETAILED DESCRIPTION

Figure 1:
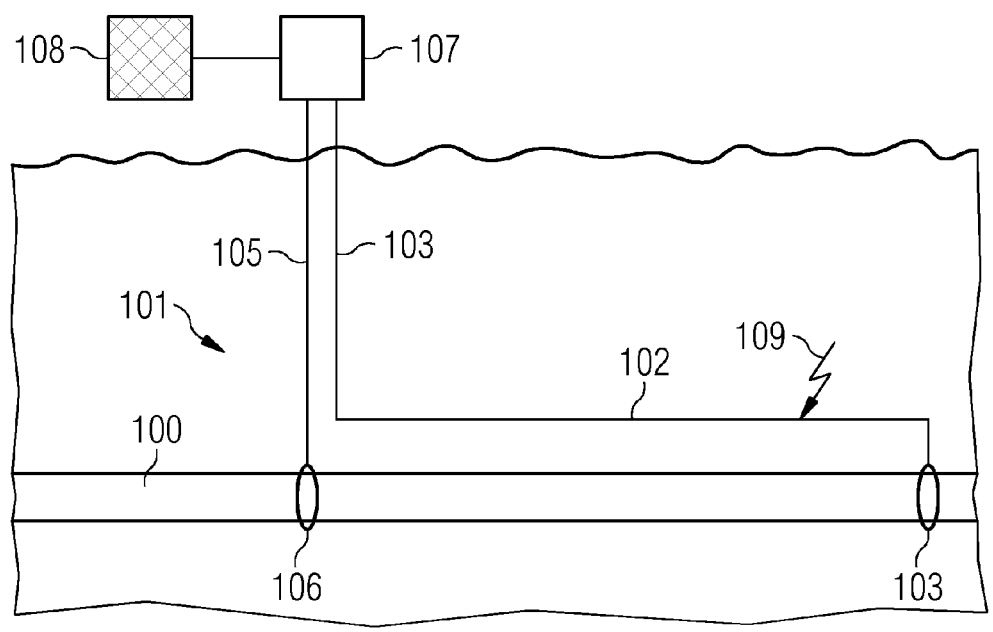
FIG. 1 shows a general overview of a system for direct electrical heating of a subsea pipeline.

FIG. 1 shows a general overview of one embodiment of a system for direct electrical heating of a subsea pipeline 100. A subsea direct electrical heating cable 101 includes a pipeline portion 102 extending along the subsea pipeline 100 and is electrically connected to the subsea pipeline 100 at a connection point 103. Another end of the pipeline portion 102 is connected (e.g., integrally connected) to one end of a first riser portion 104 of the subsea direct electrical heating cable 101. The subsea direct electrical heating cable 101 also includes a second riser portion 105 that is electrically connected with one end to the subsea pipeline 100 at a connection point 106. The other ends of the first riser portion 104 and the second riser portion 105, respectively, are connected to a power supply 107. The power supply 107 provides the subsea direct electrical heating cable 101 with power from a main power grid 108. Due to the large distance between the connection point 103 and the connection point 106, an insulation defect 109 of the pipeline portion 102 near the connection point 103 is difficult to detect in conventional ways. However, this may not only prevent heating of the remaining portion of the subsea pipeline 100 but may also seriously damage the subsea pipeline 100.

Figure 2:
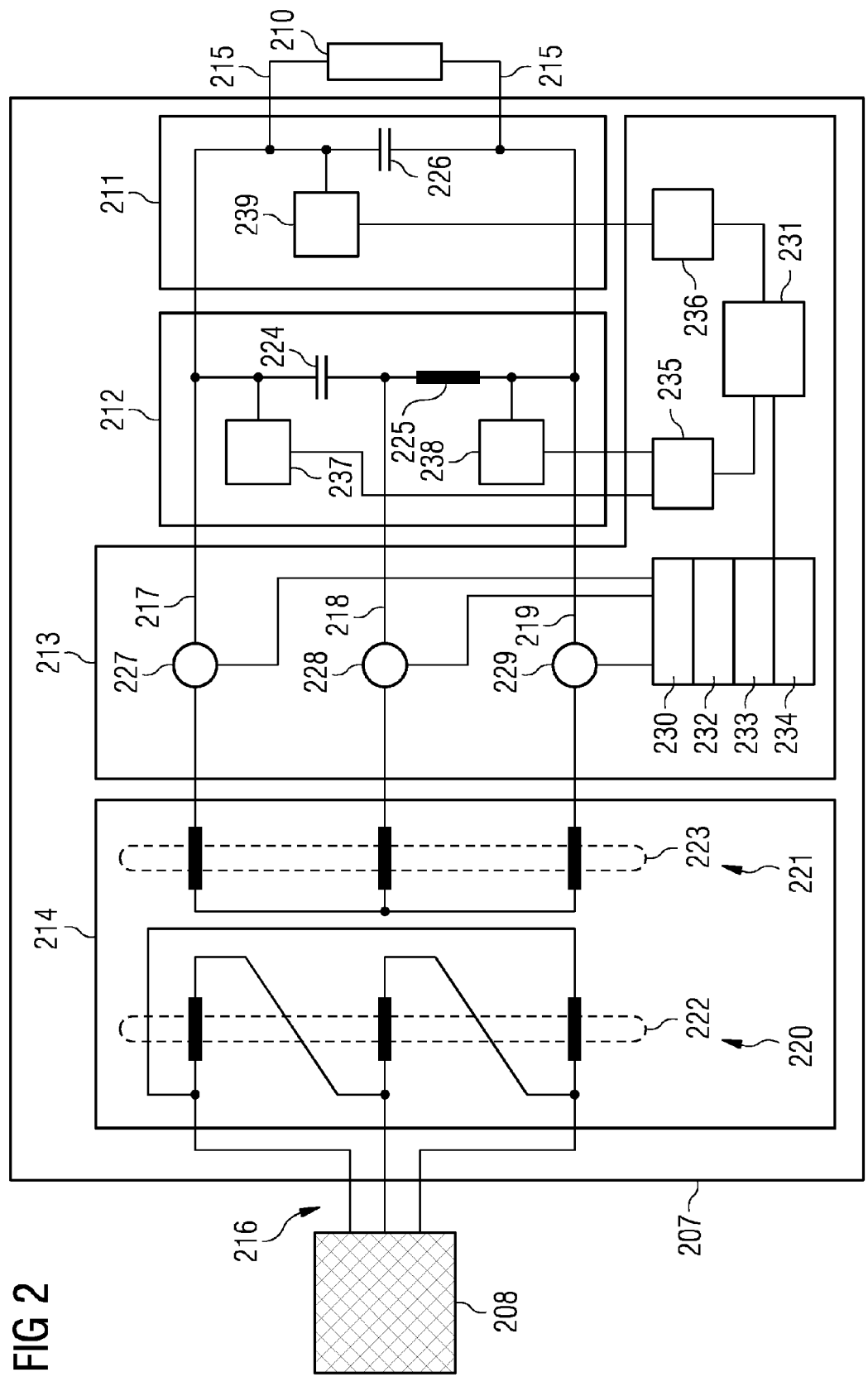
FIG. 2 shows a schematic representation of one embodiment of a power supply.

The subsea direct electrical heating cable 101 and the part of the subsea pipeline 100 through which the current passes are represented in FIG. 2 as a single phase direct electrical heating load 210. This single phase direct electrical heating load 210 is connected via a 2-wire-connection 215 to a power supply 207 that is connected to a main power grid 208 via a 3-wire-connection 216. The power supply 207 includes a balancing unit 211, a symmetrizing unit 212, a fault detection system 213, and a three-phase transformer 214.

The power supply 207 is implemented with an Isolé Terre (IT) earthing scheme. Accordingly, none of the three internal phases 217, 218, 219 of the power supply 207 are connected to earth. Accordingly, a single insulation fault within the power system is unlikely to cause hazardous high currents.

The three-phase transformer 214 includes a high voltage side 220 and a low voltage side 221. A first tap changer 222 is connected to the high voltage side 220 of the three-phase transformer 214, and a second tap changer 223 is connected to the low voltage side 221 of the three-phase transformer 214. The voltage to be provided to the direct electrical heating load 20 may be selected in the range from minimum to maximum load by operating the first tap changer 222 and the second tap changer 223. By changing the voltage level, the heating power level may be augmented or reduced. The first tap changer 222 and the second tap changer 223 may be operated while the direct electrical heating load is fully energized.

The first internal phase 217, the second internal phase 218 and the third internal phase 219 on the low voltage side 221 of the three-phase transformer 214 are connected to the symmetrizing unit 212. The symmetrizing unit 212 includes a first capacitor device 224 and an inductor device 225 to distribute the single phase direct electrical heating load 210 symmetrically among the three phases. The first capacitor device 224 is connected to the first internal phase 217 and the second internal phase 218. The inductor device 225 is provided between the second internal phase 218 and the third internal phase 219.

The capacitive and inductive values of the first capacitor device 224 and the inductive device 225 may be changed on-load (e.g., when the power system is energized). First capacitor device 224 and inductive device 225 may thus be adapted to the impedance of the direct electrical heating load 210 to reduce the negative sequence current. Accordingly, the power factor to the transformer may become very close to one, and the negative sequence current may become close to zero.

The balancing unit 211 includes a second capacitor device 226 connected to the first internal phase 217 and the third internal phase 218 and to the direct electrical heating load 210. The balancing unit 211 compensates the reactive part of the direct electrical heating load 210. The capacitive value of the second capacitor device 226 may be changed on-load.

The fault detection system 213 includes a first ammeter 227, a second ammeter 228 and a third ammeter 229. A first calculation unit 230 is provided for calculating a negative sequence current from the first phase current, the second phase current, and the third phase current measured with the first ammeter 227, the second ammeter 228, and the third ammeter 229. A detection unit 231 detects changes in the negative sequence current indicative of a subsea pipeline direct electrical heating cable fault. The fault detection system 213 includes a second calculation unit 232 and a third calculation unit 233 to calculate a positive sequence current and a relative negative sequence current, respectively. A fourth calculation unit 234 may calculate a sequence impedance matrix $Z_s$ that may serve to localize a subsea pipeline direct electrical heating cable fault. The fault detection system 213 includes a second detection unit 235 and a third detection unit 236 to account for error signal provided by the local fault detection devices 237, 238, 239 of the balancing unit 211 and the symmetrizing unit 212.

Figure 3:
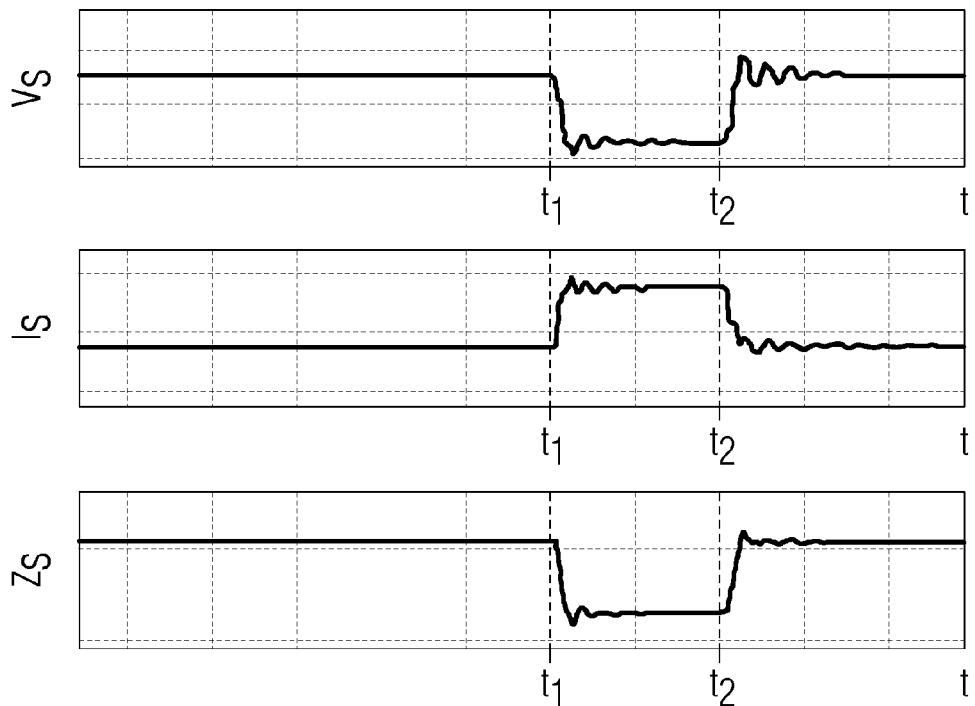
FIG. 3 shows exemplary effective voltage, effective current and sub-sea impedance curves changes due to a subsea short circuit.

FIG. 3 shows a simulation of the development of effective subsea voltage $V_s$, effective subsea current $I_s$, and subsea impedance $Z_s$ over time. In a time interval from $t_1$ to $t_2$, an insulation defect 109 occurs near connection point 103. The distance from connection point 106 to the insulation defect 109 is approximately 97 percent of the distance between the connection point 109 and the connection point 106.

The effective subsea voltage drops from approximately 9850 volts to approximately 9750 volts at $t_1$ and rises from approximately 9750 volts to approximately 9850 volts again at $t_2$. Correspondingly, the effective subsea current rises from approximately 1540 ampere to approximately 1560 ampere at $t_1$ and drops again to 1540 ampere at $t_2$. Such a change in the order of 1 percent (voltage) or 1.3 percent (current) is very difficult to detect by conventional measuring equipment. Even the subsea impedance drops only from approximately 6.4 ohms to approximately 6.2 ohms thus by only approximately 3.0 percent in the interval from $t_1$ to $t_2$.

Figure 4:
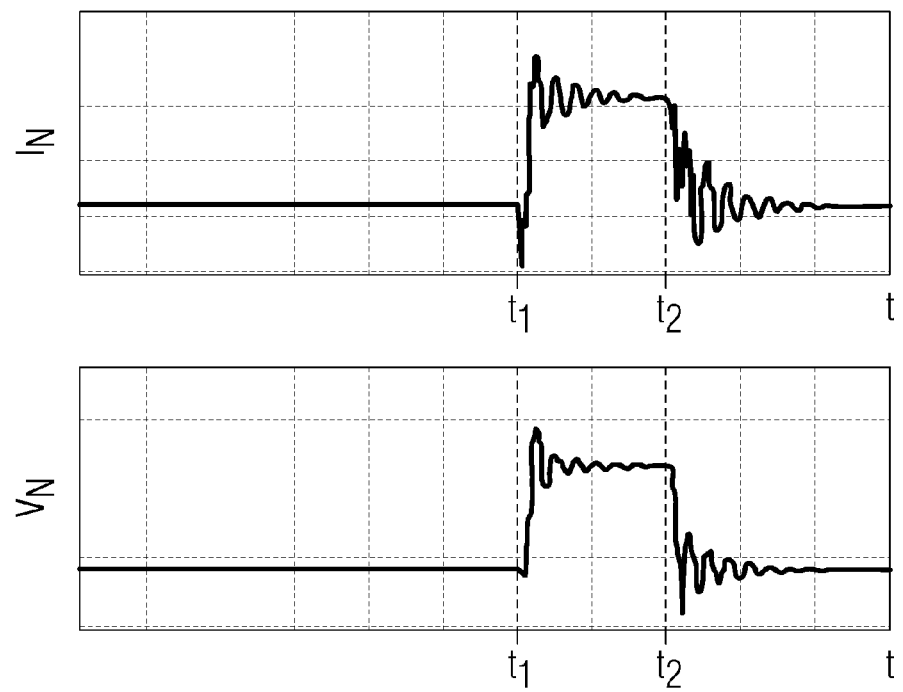
FIG. 4 shows exemplary negative sequence voltage and negative currant changes due to a subsea short circuit.

FIG. 4 shows the corresponding behavior of negative sequence current $I_N$ and negative sequence voltage $V_N$ for the same time interval. Even if the symmetrizing unit of the power supply may be adaptable to different single phase direct electrical heating loads, a low effective negative sequence current from 5 to 10 amperes and a low effective negative sequence voltage may be present even if there is no insulation defect. However, from $t_1$ to $t_2$, the effective negative sequence voltage is with approximately 65 volts around 3 times as high as the effective negative sequence voltage of 22 volts without an insulation defect. In the same interval, the effective negative sequence current raises from approximately 9 amperes to 25 amperes. Such current and voltage changes are easily detectable.

It should be noted that the term "comprising" does not exclude other elements or steps, and the use of articles "a" or "an" does not exclude a plurality. Also, elements described in association with different embodiments may be combined.

The claimed fault detection system, power supply, fault detection method, and program element for a subsea direct electrical heating cable offers substantial advantages over known systems.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A fault detection system for subsea pipeline direct electrical heating cables, the fault detection system comprising:
   a first ammeter that measures a first phase current in the subsea pipeline direct electrical heating cables;

a second ammeter that measures a second phase current in the subsea pipeline direct electrical heating cables;
a third ammeter that measures a third phase current in the subsea pipeline direct electrical heating cables;
a first calculation unit that calculates a negative sequence current from the first phase current, the second phase current, and the third phase current; and
a first detection unit that detects a change in the negative sequence current, wherein the change in the negative sequence current indicates a fault in the subsea pipeline direct electrical heating cables.

2. The fault detection system of claim 1, further comprising:
a second calculation unit that calculates a positive sequence current from the first phase current, the second phase current, and the third phase current; and
a third calculation unit that divides the negative sequence current by the positive sequence current to obtain a relative negative sequence current, wherein the first detection unit detects a change in the relative negative sequence current.

3. The fault detection system of claim 2, further comprising:
a fourth calculation unit that calculates a sequence impedance matrix.

4. The fault detection system of claim 3, further comprising:
a second detection unit that receives a signal indicating a malfunctioning of a symmetrizing unit.

5. The fault detection system of claim 4, further comprising:
a third detection unit that receives a signal indicating a malfunctioning of a balancing unit.

6. The fault detection system of claim 1, further comprising:
a second detection unit that receives a signal indicating a malfunctioning of a symmetrizing unit.

7. The fault detection system of claim 6, further comprising:
a third detection unit that receives a signal indicating a malfunctioning of a balancing unit.

8. A power supply for subsea pipeline direct electrical heating cables, the power supply comprising:
a symmetrizing unit that symmetrizes a load; and
a fault detection system comprising:
a first ammeter that measures a first phase current in the subsea pipeline direct electrical heating cables;
a second ammeter that measures a second phase current in the subsea pipeline direct electrical heating cables;
a third ammeter that measures a third phase current in the subsea pipeline direct electrical heating cables;
a first calculation unit that calculates a negative sequence current from the first phase current, the second phase current, and the third phase current; and
a first detection unit that detects a change in the negative sequence current, wherein the change in the negative sequence current indicates a fault in the subsea pipeline direct electrical heating cables.

9. The power supply of claim 8, further comprising:
a balancing unit that balances the load.

10. The power supply of claim 9, further comprising:
a local fault detection device that detects a malfunctioning of the symmetrizing unit, the balancing unit, or the symmetrizing unit and the balancing unit.

11. The power supply of claim 9, further comprising:
a three-phase transformer.

12. The power supply of claim 8, further comprising:
a local fault detection device that detects a malfunctioning of the symmetrizing unit, the balancing unit, or the symmetrizing unit and the balancing unit.

13. The power supply of claim 12, further comprising:
a three-phase transformer.

14. The power supply of claim 8, further comprising:
a three-phase transformer.

15. A fault detection method for subsea pipeline direct electrical heating cables, the fault detection method comprising:
measuring a first phase current in the subsea pipeline direct electrical heating cables;
measuring a second phase current in the subsea pipeline direct electrical heating cables;
measuring a third phase current in the subsea pipeline direct electrical heating cables;
calculating a negative sequence current from the first phase current, the second phase current, and the third phase current; and
detecting a change in the negative sequence current that indicates a fault in the subsea pipeline direct electrical heating cables.

16. The fault detection method of claim 15, further comprising:
calculating a positive sequence current from the first phase current, the second phase current, and the third phase current;
dividing the negative sequence current by the positive sequence current to obtain a relative negative sequence current; and
detecting a change in the negative sequence current by detecting a change in the relative negative sequence current.

17. The fault detection method of claim 16 further comprising:
calculating a sequence impedance matrix from the first phase current, the second phase current, and the third phase current;
calculating a change of sequence voltages based on the sequence impedance matrix; and
calculating a load impedance change based on the change of sequence voltages.

18. The fault detection method of claim 15, further comprising:
calculating a sequence impedance matrix from the first phase current, the second phase current, and the third phase current;
calculating a change of sequence voltages based on the sequence impedance matrix; and
calculating a load impedance change based on the change of sequence voltages.

19. A non-transitory computer-readable medium on which a computer program for processing a physical object is stored, the computer program, when executed by a data processor, causes the fault detection system for subsea pipeline direct electrical heating cables to:
measure a first phase current in the subsea pipeline direct electrical heating cables;
measure a second phase current in the subsea pipeline direct electrical heating cables;
measure a third phase current in the subsea pipeline direct electrical heating cables;
calculate a negative sequence current from the first phase current, the second phase current, and the third phase current; and detect a change in the negative sequence current that indicates a fault in the subsea pipeline direct electrical heating cables.

* * * * *